(12) United States Patent
Lai et al.

(10) Patent No.: US 7,694,721 B2
(45) Date of Patent: Apr. 13, 2010

(54) MINIATURE LIQUID COOLING DEVICE HAVING AN INTEGRAL PUMP

(75) Inventors: Cheng-Tien Lai, Tu-Cheng (TW);
Zhi-Yong Zhou, Shenzhen (CN);
Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 784 days.

(21) Appl. No.: 11/309,612

(22) Filed: Aug. 31, 2006

(65) Prior Publication Data

US 2008/0053641 A1 Mar. 6, 2008

(51) Int. Cl.
*F28F 7/00* (2006.01)
*H05K 7/20* (2006.01)

(52) U.S. Cl. .................................. 165/80.4; 165/104.33

(58) Field of Classification Search ................ 165/80.4, 165/104.33, 108; 361/699, 702, 698; 257/714
See application file for complete search history.

(56) References Cited

U.S. PATENT DOCUMENTS

| | | | |
|---|---|---|---|
| 6,894,899 B2 * | 5/2005 | Wu et al. ..................... | 361/699 |
| 6,935,411 B2 | 8/2005 | Valenzuela | |
| 7,013,959 B2 | 3/2006 | Lee et al. | |
| 7,249,625 B2 * | 7/2007 | Duan ......................... | 165/80.4 |
| 7,274,566 B2 * | 9/2007 | Campbell et al. ........... | 361/699 |
| 2004/0000157 A1 * | 1/2004 | Imada et al. ................ | 62/259.2 |
| 2004/0240179 A1 * | 12/2004 | Koga et al. .................. | 361/699 |
| 2005/0168079 A1 * | 8/2005 | Wos .............. | 310/52 |
| 2005/0241312 A1 * | 11/2005 | Hata et al. .................... | 60/649 |
| 2005/0243520 A1 * | 11/2005 | Tomioka et al. ............. | 361/702 |
| 2006/0191667 A1 * | 8/2006 | Chen et al. .................. | 165/80.4 |

FOREIGN PATENT DOCUMENTS

| | | |
|---|---|---|
| JP | 2006190735 | 7/2006 |
| TW | M273031 | 8/2005 |

* cited by examiner

*Primary Examiner*—Tho V Duong
(74) *Attorney, Agent, or Firm*—Frank R. Niranjan

(57) ABSTRACT

A miniature liquid cooling device includes a casing (10) having a base (16) attached on a heat-generating electronic component for absorbing heat generated by the electronic component. The casing includes an outer wall (12) mounted on the base and a top cover (15) mounted on the outer wall. A receiving space is enclosed by the casing. A heat-absorbing member (40) is attached on the base and received in the receiving space for exchanging heat with liquid in the casing. An impeller (21) is rotatably mounted in the receiving space and above the heat-absorbing member. When the impeller rotates the liquid is driven to flow into the liquid cooling device via a liquid inlet (122) and then flow through the heat-absorbing member and finally flow out of the liquid cooling device via a liquid outlet (124).

18 Claims, 4 Drawing Sheets

MINIATURE LIQUID COOLING DEVICE HAVING AN INTEGRAL PUMP

FIELD OF THE INVENTION

The present invention relates generally to a liquid cooling device for heat-generating electronic components, and more particularly to a miniature liquid cooling device having an integral pump therein.

DESCRIPTION OF RELATED ART

With continuing development of the computer technology, electronic packages such as central process units (CPUs) are generating more and more heat that is required to be dissipated immediately. The conventional heat dissipating devices such as combined heat sinks and fans are not competent for dissipating so much heat any more. Liquid cooling systems have thus been increasingly used in computer technology to cool these electronic packages.

A typical liquid cooling system generally comprises a heat-absorbing member, a heat-dissipating member and a pump. These individual components are connected together in series so as to form a heat transfer loop. In practice, the heat-absorbing member is maintained in thermal contact with a heat-generating component (e.g., a CPU) for absorbing heat generated by the CPU. The liquid cooling system employs a coolant circulating through the heat transfer loop so as to continuously bring the thermal energy absorbed by the heat-absorbing member to the heat-dissipating member where the heat is dissipated. The pump is used to drive the coolant, after being cooled in the heat-dissipating member, back to the heat-absorbing member.

In the typical liquid cooling system, the heat-absorbing member, the heat-dissipating member and the pump are connected together generally by a plurality of connecting tubes so as to form the heat transfer loop. However, the typical liquid cooling system has a big volume and occupies more room in a computer system, and is not adapted to a small room of a notebook PC. Furthermore, the liquid cooling system has many connecting tubes with a plurality of connections, which is prone to lead to a leakage of the coolant so that the system has a low reliability and a high cost. Moreover, the heat-absorbing member, the heat-dissipating member and the pump are to be located at different locations when mounted to the computer system. In this situation, mounting of the liquid cooling system to the computer system or demounting of the liquid cooling system from the computer system is a burdensome and time-consuming work.

Therefore, it is desirable to provide a liquid cooling system which overcomes the foregoing disadvantages.

SUMMARY OF THE INVENTION

A miniature liquid cooling device in accordance with an embodiment of the present invention for removing heat from a heat-generating electronic component includes a casing having a base attached on the heat-generating electronic component for absorbing the heat generated by the electronic component. The casing includes an outer wall mounted on the base and a receiving space enclosed by the outer wall. A heat-absorbing member is attached on the base and received in the receiving space for exchanging heat with liquid in the casing. An impeller is rotatably mounted in the receiving space and above the heat-absorbing member. When the impeller rotates the liquid is driven to flow into the liquid cooling device via a liquid inlet and then flow through the heat-absorbing member to finally flow out of the liquid cooling device via a liquid outlet.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
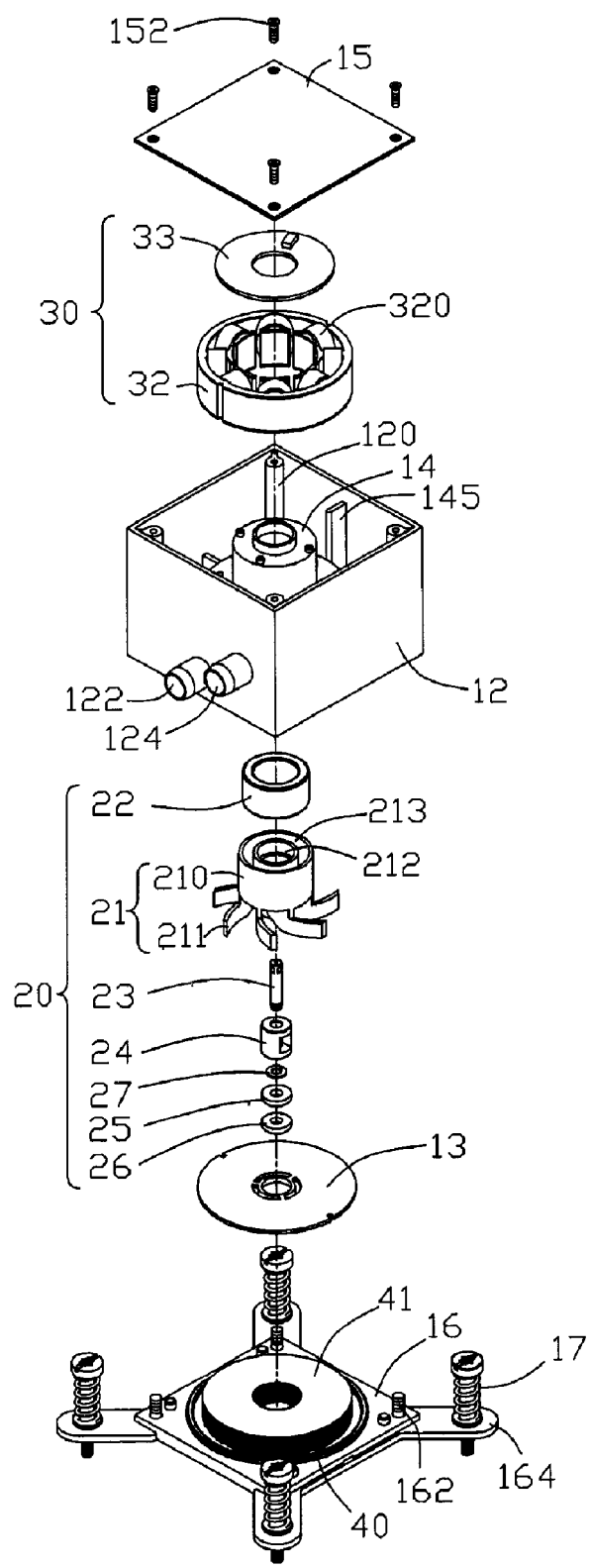
FIG. 1 is an exploded, isometric view of a miniature liquid cooling device according to a preferred embodiment of the present invention.
Figure 2:
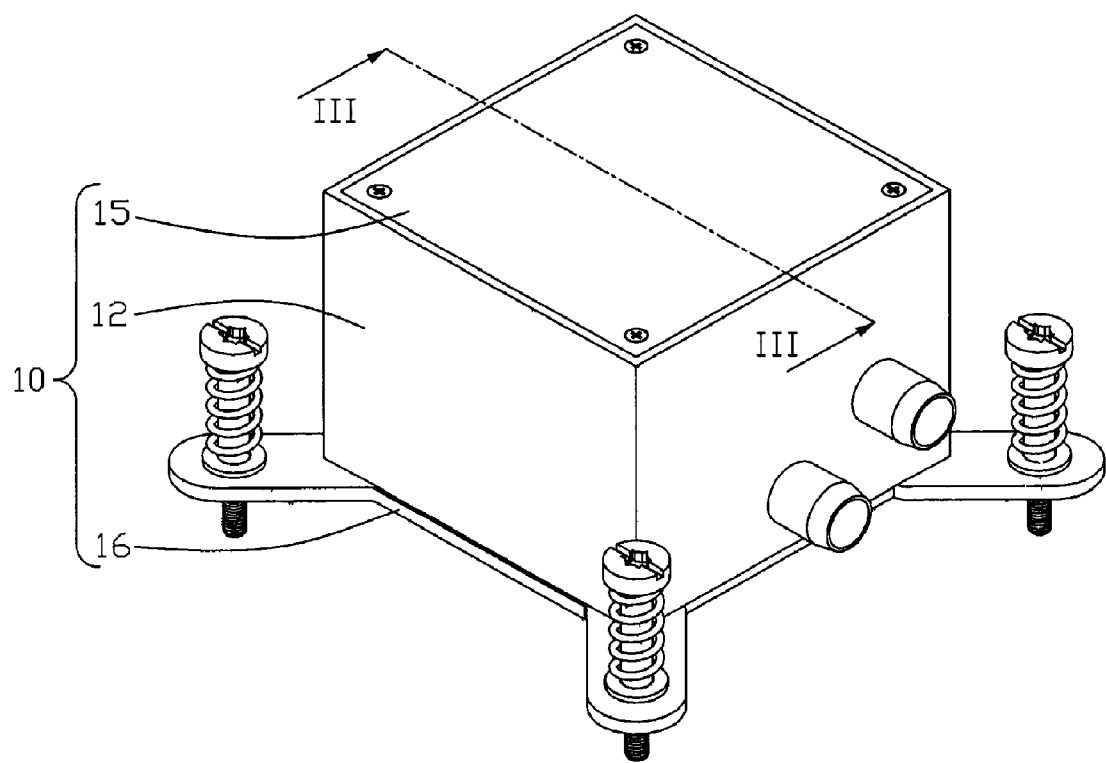
FIG. 2 is an assembled view of the miniature liquid cooling device of FIG. 1.

Referring to FIGS. 1 and 2, a miniature liquid cooling device in accordance with a preferred embodiment of the present invention comprises a casing 10 having an inner space, and a liquid circulating unit 20, a motor driving unit 30 and a heat-absorbing member 40 received in the inner space of the casing 10.

The casing 10 comprises a cube-shaped outer wall 12 having a hollow main body 14 received therein, a top cover 15 hermetically attached to a top end of the outer wall 12, and a bottom base 16 attached to a bottom end of the outer wall 12. A sealing ring 121 (FIG. 3) is disposed between the outer wall 12 and the bottom base 16 to prevent liquid leakage. An inlet 122 is formed on the outer wall 12 of the casing 10 for allowing liquid to enter the casing 10. An outlet 124 is also formed on the outer wall 12 of the casing 10 for allowing the liquid to exit the casing 10. The outlet 124 is located above the inlet 122.

The outer wall 12 of the casing 10 has four posts 120 formed at four corners thereof. The top cover 15 is mounted on the outer wall 12 by bringing four screws 152 to extend through the top cover 15 and screw into the posts 120. Also referring to FIG. 3, the main body 14 is used for isolating the motor driving unit 30 from the liquid and comprises first and second parts 140, 142 each having a cylindrical configuration, wherein the second part 142 is located below the first part 140, communicates with the first part 140 and has a diameter larger than that of the first part 140. The second part 142 has a bottom end connecting with the outer wall 12. An annular wall 144 extends upwardly from a center of a top wall 143 of the first part 140 for being surrounded by a printed circuit board 33 of the motor driving unit 30. Two annular steps 146 are formed at a joint of the first part 140 and the second part 142 for supporting the motor driving unit 30 thereon.

Again referring to FIG. 3, a spacing plate 13 is horizontally arranged at the bottom end of the main body 14. The spacing plate 13 cooperates with the main body 14 to divide the inner space of the casing 10 into a first chamber 130 above the spacing plate 13 and in the main body 14, a second chamber 132 below the spacing plate 13 and a third chamber 133 above the spacing plate 13 and outside and around the main body 14. The inlet 122 is located corresponding to the second chamber 132 and communicates with the second chamber 132. The outlet 124 is located corresponding to the first chamber 130 and communicates with the first chamber 130. A round downward protrusion 134 is formed at a center of the spacing plate 13. A plurality of through openings 135 is defined in the spacing plate 13 adjacent to and around the downward protrusion 134 to intercommunicate the first and second chambers 130, 132, thereby permitting the liquid to flow from the second chamber 132 into the first chamber 130 through the through openings 135. A supporting cylindrical wall 136 extends from a bottom of the spacing plate 13 for abutting against the heat-absorbing member 40.

Again referring to FIG. 1, the bottom base 16 has a rectangular configuration. The base 16 is mounted on the bottom end of the outer wall 12 by bringing four screws 162 to extend through the base 16 and screw into bottom ends of the posts 120 of the outer wall 12. The base 10 forms four ears 164 outwardly extending from four corners thereof, wherein a mounting hole (not labeled) is defined in each ear 164 for receiving a fastener 17 therein. The liquid cooling device is directly attached to a heat-generating electronic component (not shown) by extending the four fasteners 17 through the four ears 164 to threadedly engage with a retainer (not shown) attached to a printed circuit board (not shown) on which the electronic component is mounted. The bottom base 16 serves as a heat-absorbing plate to contact with the heat-generating electronic component and absorb heat generated by the electronic component.

Figure 3:
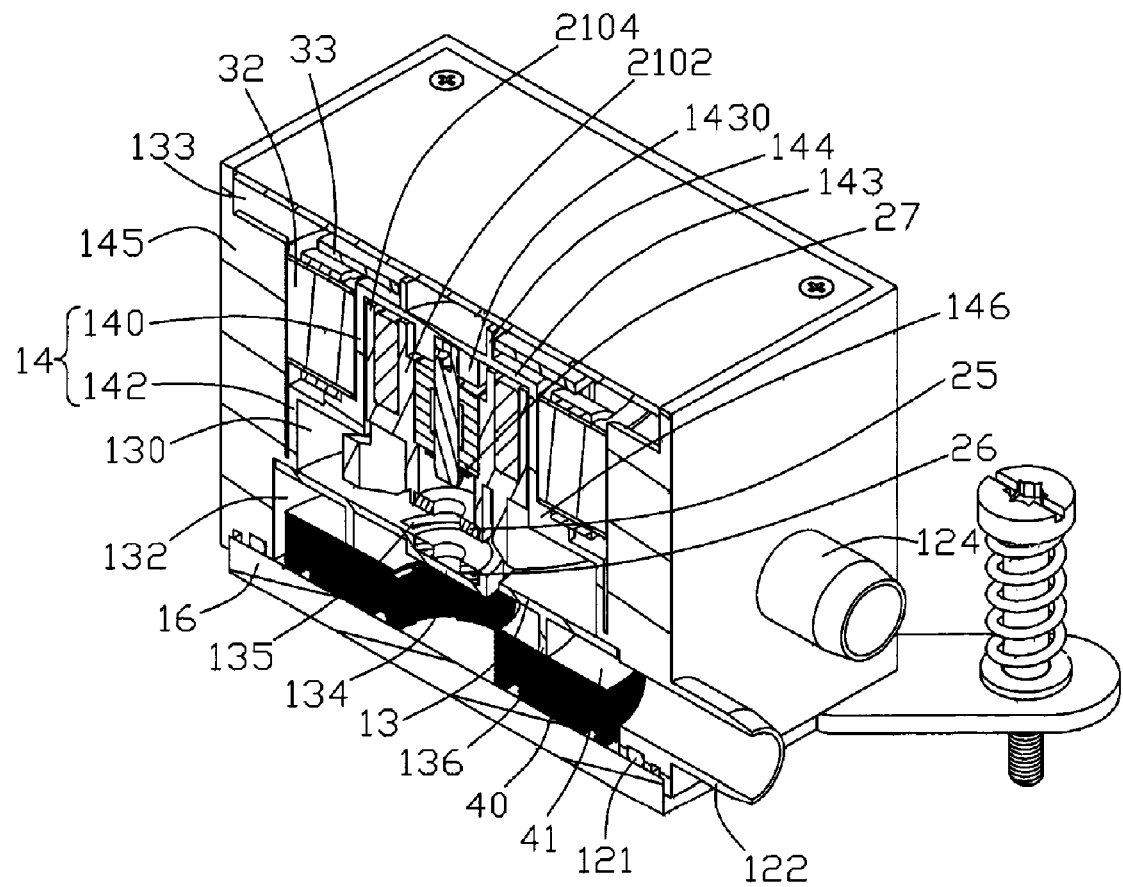
FIG. 3 is a cross-sectional view taken along line III-III of FIG. 2.

Referring to FIGS. 1 and 3, the liquid circulating unit 20 is received in the first chamber 130 of the casing 10. The liquid circulating unit 20 comprises an impeller 21, a shaft 23 mounted on the top wall 143 of the main body 14 and a bearing 24 pivotably attached to the shaft 22. The impeller 21 comprises a cylindrical hub 210 and a plurality of curved blades 211 radially extending from a bottom end of the hub 210. The hub 210 has a central through hole 212 for receiving the shaft 23 and the bearing 24 therein. The hub 210 comprises an inner wall 2102 and an outer wall 2104 connecting with the inner wall 2102. An annular recess 213 is defined between the inner and outer walls 2102, 2104. The annular recess 213 receives a permanent magnet 22 therein. The permanent magnet 22 has a substantially hollow cylindrical body magnetized so as to have a plurality of alternating N and S poles along the cylindrical body. For positioning the shaft 25, the top wall 143 of the main body 14 downwardly forms a shaft support 1430 having a center blind hole (not labeled) receiving a top end of the shaft 23 therein. A locking ring 27 is attached to the shaft 23 near a bottom end thereof for limiting axial movement of the shaft 23. The impeller 21 uses a pair of annular magnetic spacers 25, 26 to control its axial position. The magnetic spacers 25, 26 are spaced from each other, wherein the magnetic spacer 25 is embedded in a bottom end of the through hole 212 of the hub 210 and rotates with the impeller 26, the magnetic spacer 26 is received in the downward protrusion 134 of the spacing plate 13. Each of the magnets 25, 26 has a north (N) pole and an opposite south (S) pole. The magnetic spacers 25, 26 are arranged so that the S pole of the magnetic spacer 25 faces the S pole of the magnetic spacer 26. Since like magnetic poles face each other so that a repulsive force F exists between the magnet spacers 25, 26, and the impeller 21 has an upward force F exerted thereon by the magnetic spacer 25. The magnetic spacers 25, 26 are used to provide the upward force F to the impeller 21 to balance the force G of gravity acting on the impeller 21. The impeller 21 is attached to the bearing 24 to rotate therewith in respect to the shaft 23.

The motor driving unit 30 is received in the third chamber 133 of the casing 10 and comprises a motor having a stator 32 and the printed circuit board 33 electrically connecting with the stator 32. The stator 32 is mounted around the first part 140 of the main body 14 in the casing 10. The stator 32 is supported by the two steps 146 formed on the main body 14 in an axial direction and supported by two opposite baffle plates 145 formed on the outer wall 12 in a radial direction. The printed circuit board 33 is mounted around the annular wall 144 formed on the top wall 143 of the main body 14. The stator 32 has a plurality of coils 320 wrapped thereon. The coils are used for providing a path for a current controlled by the printed circuit board 33 to flow therethrough. A magnetic field is established when the current flows through the coils 320, which interacts with the magnet 22 to cause the impeller 21 to rotate.

Figure 4:
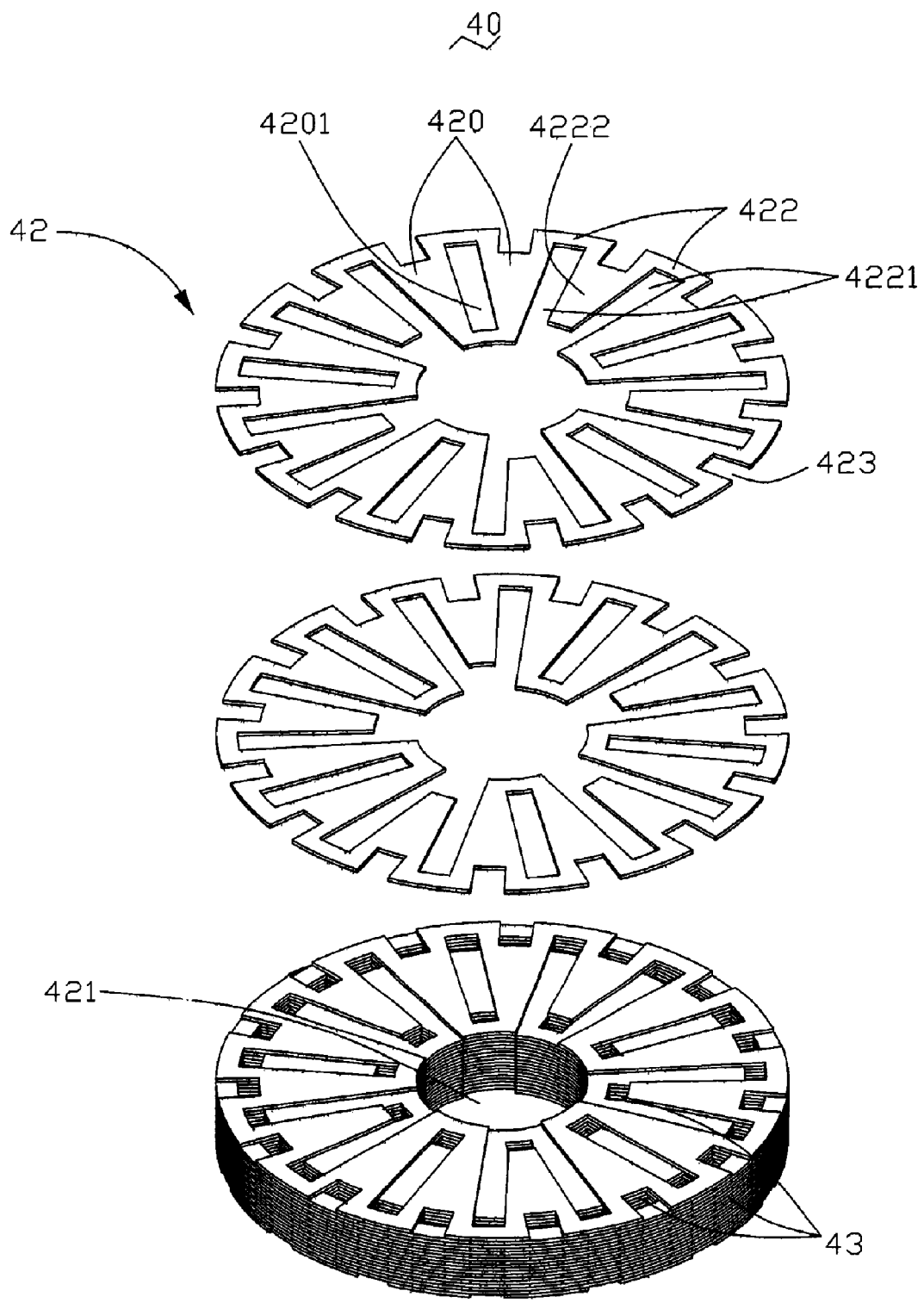
FIG. 4 is a partially exploded and enlarged view of a heat-absorbing member of the miniature liquid cooling device of FIG. 1.

Referring to FIGS. 3 and 4, the heat-absorbing member 40 is received in the second chamber 132 of the casing 10 for absorbing the heat generated by the electronic component. A mounting plate 41 is attached on the heat-absorbing member 40 for abutting against the cylindrical wall 136 of the spacing plate 13, thereby supporting the spacing plate 13 thereon. The mounting plate 41 defines a central hole (not labeled) therein, which is in alignment with a central through hole 421 of the heat-conducting member 40. The heat-absorbing member 40 is made of highly thermally conductive materials such as copper or copper alloys. In this embodiment of the present invention the heat-absorbing member 40 consists of a plurality of copper flakes 42. Each of the copper flakes 42 has an annular configuration and comprises alternating first and second portions 420, 422. A plurality of evenly spaced cutouts 423 is circumferentially defined at an outer edge of each flake 42. Each first portion 420 defines an elongated aperture 4201 at a middle thereof, extending along a radial direction of the flake 42. Each second portion 422 defines a pair of symmetrical elongated apertures 4221 extending along the radial direction. Each of the two apertures 4221 is located at a boundary between each first portion 420 and each second portion 422, and communicates with the through hole 421. A body 4222 is formed and located between the two apertures 4221 of each second portion 422. The body 4222 has a length shorter than that of the aperture 4201 of the first portion 420. During assembly of the flakes 42, the flakes 42 are coaxially aligned with each other and the bodies 4222 of the second portions 422 of each flake 42 are stacked on the first portions 420 of an adjacent flake 42 and in alignment with the apertures 4201 of the adjacent flake 42, respectively, to form a plurality of channels 43 in the heat-absorbing member 40. Thus, the flakes 42 are stacked together to form the heat-absorbing member 40. These channels 43 are communicated with each other and with the central through hole 421. These channels 43 includes a plurality of vertical channels near the outer edges of the flakes 42 and near the central through hole 421, and a plurality of radial channels interconnecting the through hole 421 and the vertical channels.

In operation, the liquid cooling device is fixed to the printed circuit board such that the bottom base 16 of the liquid cooling device intimately contacts with the electronic component mounted on the printed circuit board. The heat generated by the electronic component is absorbed by the base 16 and transferred to heat-absorbing member 40. The liquid contained in the second chamber 132 which is forced to flow through the heat-absorbing member 40 absorbs the heat from the heat-absorbing member 40. Thereafter, the liquid is discharged out of the second chamber 132 via the through openings 135 into the first chamber 130 by a centrifugal force produced by rotation of the impeller 21. Due to the central through hole 421 and the channels 43 defined in the heat-absorbing member 40, the liquid and the heat-absorbing member 40 have a large contact area for realizing a sufficient heat exchange between the liquid and the heat-absorbing member 40. In more details, the liquid is driven by the rotation of the impeller 21 to flow from a liquid source (not shown) into the second chamber 132 via the inlet 122. Then the liquid flows through the heat-absorbing member 40 to absorb the heat therefrom. After absorbing the heat, the liquid flows into the first chamber 130 via the through openings 135. Finally, the liquid is driven to flow from the first chamber 130 back into the liquid source via the outlet 124 to finish a heat exchange cycle with the heat-absorbing member 40. The liquid source can thermally connect with a plurality of fins (not shown) for dissipating the heat absorbed by the liquid into a surrounding environment. Thus, the miniature liquid cooling device in accordance with the present invention which has a liquid pump integral therein can effectively dissipate the heat generated by the electronic component.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling device, comprising:
   a casing comprising a base adapted for being attached on a heat-generating electronic component for absorbing heat generated by the electronic component, an outer wall mounted on the base and a top cover mounted on the outer wall, a receiving space being enclosed by the casing, the outer wall forming an inlet and an outlet thereon both intercommunicating with the receiving space and adapted for connecting with a liquid source;
   a heat-absorbing member received in the receiving space and attached on the base for exchanging heat with liquid in the casing;
   an impeller rotatably mounted in the receiving space and above the heat-absorbing member, wherein when the impeller rotates the liquid is driven to flow into the liquid cooling device via the inlet and then flow through the heat-absorbing member and finally flow out of the liquid cooling device via the outlet, a magnet being attached to the impeller; and
   a motor driving unit received in the casing and interacting with the magnet for driving the impeller to rotate;
   wherein the heat-absorbing member consists of a plurality of annular flakes coaxially stacked together, a plurality of channels being defined between the flakes for providing passage for the liquid to flow through the heat-absorbing member; and
   wherein each of the annular flakes defines a through hole at a center thereof and comprises alternating first and second portions, each first portion defining an elongated aperture extending along a radial direction of the each flake, each second portion defining a pair of symmetrical elongated apertures extending along the radial direction and communicating with the through hole.

2. The liquid cooling device of claim 1, wherein each second portion comprises a body formed between the two apertures thereof, the body having a length shorter than that of the aperture of the first portion.

3. The liquid cooling device of claim 2, wherein the plurality of first portions of each annular flake are positioned on the plurality of second portions of an adjacent annular flake, respectively, and the bodies of the second portions are located corresponding to the apertures of the first portions, respectively.

4. The liquid cooling device of claim 1, wherein a plurality of evenly spaced cutouts circumferentially defined at an outer edge of each annular flake.

5. The liquid cooling device of claim 1, wherein a hollow main body is received in the receiving space of the casing and connected with the outer wall of the casing, the impeller being received in the hollow main body.

6. The liquid cooling device of 5, wherein the main body is used for isolating the motor driving unit from the liquid and comprises first and second parts each having a cylindrical configuration, the second part communicating with the first part and having a diameter larger than that of the first part and having a bottom end connecting with the outer wall of the casing, the first part being located above the second part.

7. The liquid cooling device of claim 6, wherein the motor driving unit comprises a motor having a stator and a printed circuit board electrically connecting with the stator, the stator being mounted around the first part of the main body, the printed circuit board being mounted on a top wall of the main body.

8. The liquid cooling device of claim 6, wherein the first part comprises a top wall, a shaft being downwardly mounted on the top wall.

9. The liquid cooling device of claim 8, wherein a bearing is mounted to the shaft and rotatable in respect thereto, the impeller being attached to the bearing to rotate therewith.

10. The liquid cooling device of claim 6, wherein a spacing plate is horizontally arranged at the bottom end of the second part of the main body, and the spacing plate defines a plurality of through openings for providing passage of the liquid into the main body.

11. The liquid cooling device of claim 10, wherein a supporting cylindrical wall extends from a bottom of the spacing plate for abutting against the heat-absorbing member.

12. The liquid cooling device of claim 10, wherein the impeller uses first and second annular magnetic spacers to control its axial position.

13. The liquid cooling device of claim 12, wherein a round downward protrusion is formed at a center of the spacing plate for receiving the first annular magnetic spacer and the second annular magnetic spacer facing the first annular magnetic spacer is received in a lower portion of the impeller.

14. The liquid cooling device of claim 13, wherein each of the first and second magnetic spacers has a north pole and an opposite south pole, the first magnetic spacer and the second magnetic spacer have same poles at facing surfaces thereof so that a repulsive force exists therebetween.

15. The liquid cooling device of claim 1, wherein the impeller comprises a cylindrical hub and a plurality of curved blades radially extending from a bottom end of the hub, the hub having a central through hole for receiving a shaft and a bearing therein.

16. The liquid cooling device of claim 15, wherein the hub of the impeller comprises an inner wall and an outer wall connecting with the inner wall, an annular recess being defined between the inner and outer walls of the impeller, the magnet being received in the annular recess.

17. A liquid cooling device for a heat-generating electronic component, comprising:

a casing defining a first chamber, a second chamber below the first chamber and a third chamber surrounding the first chamber wherein the first and second chambers are in fluidic communication with each other and the third chamber is in fluidic isolation from the first and second chambers, the casing farther comprising a liquid inlet communicating with the second chamber and a liquid outlet communicating with the first chamber;

a motor driving unit including a stator mounted in the third chamber;

a heat-absorbing member mounted in the second chamber, adapted for receiving heat from the heat-generating electronic component;

an impeller rotatably mounted in the first chamber, having a magnet for interacting with the stator to drive the impeller to rotate, wherein when the impeller rotates, liquid flows from the inlet through the heat-absorbing member, then the first chamber to leave the first chamber via the liquid outlet, whereby the heat absorbed by the heat-absorbing member from the electronic component is dissipated by the liquid;

wherein the heat-absorbing member consists of a plurality flakes stacked on each other, a through hole is defined in a center of the heat-absorbing member, a plurality of vertical channels and a plurality of radial channels are defined in the heat-absorbing member, the radial channels interconnect the through hole and the vertical channels.

18. A liquid cooling device, comprising:

a casing comprising a base adapted for being attached on a heat-generating electronic component for absorbing heat generated by the electronic component, an outer wall mounted on the base and a top cover mounted on the outer wall, a receiving space being enclosed by the casing, the outer wall forming an inlet and an outlet thereon both intercommunicating with the receiving space and adapted for connecting with a liquid source;

a heat-absorbing member received in the receiving space and attached on the base for exchanging heat with liquid in the casing;

an impeller rotatably mounted in the receiving space and above the heat-absorbing member, wherein when the impeller rotates the liquid is driven to flow into the liquid cooling device via the inlet and then flow through the heat-absorbing member and finally flow out of the liquid cooling device via the outlet, a magnet being attached to the impeller; and a motor driving unit received in the casing and interacting with the magnet for driving the impeller to rotate;

wherein the heat-absorbing member consists of a plurality of annular flakes coaxially stacked together, a plurality of channels is defined between the flakes for providing passage for the liquid to flow through the heat-absorbing member; and wherein a plurality of evenly spaced cutouts circumferentially defined at an outer edge of each annular flake.

* * * * *